United States Patent
Leipold et al.

(10) Patent No.: US 9,698,751 B2
(45) Date of Patent: Jul. 4, 2017

(54) RADIO FREQUENCY FILTERING CIRCUITRY WITH RESONATORS

(71) Applicant: RF Micro Devices, Inc., Greensboro, NC (US)

(72) Inventors: Dirk Robert Walter Leipold, San Jose, CA (US); George Maxim, Saratoga, CA (US); Marcus Granger-Jones, Scotts Valley, CA (US); Nadim Khlat, Cugnaux (FR); Baker Scott, San Jose, CA (US)

(73) Assignee: Qorvo US, Inc., Greensboro, NC (US)

( * ) Notice: Subject to any disclaimer, the term of this patent is extended or adjusted under 35 U.S.C. 154(b) by 62 days.

(21) Appl. No.: 14/931,165

(22) Filed: Nov. 3, 2015

(65) Prior Publication Data

US 2016/0126929 A1    May 5, 2016

Related U.S. Application Data

(60) Provisional application No. 62/074,452, filed on Nov. 3, 2014.

(51) Int. Cl.
*H03H 7/46* (2006.01)
*H01F 17/00* (2006.01)

(52) U.S. Cl.
CPC ......... *H03H 7/463* (2013.01); *H01F 17/0006* (2013.01)

(58) Field of Classification Search
CPC ............................. H03H 7/463; H01F 17/006
USPC .......................................................... 333/132
See application file for complete search history.

(56) References Cited

U.S. PATENT DOCUMENTS 4,091,344 A * 5/1978 LaTourrette .......... H01P 1/2136
                                                      333/134

* cited by examiner

*Primary Examiner* — Robert Pascal
*Assistant Examiner* — Kimberly Glenn
(74) *Attorney, Agent, or Firm* — Withrow & Terranova, P.L.L.C.

(57) ABSTRACT

RF multiplexer circuitry includes a first signal path coupled between a first intermediate node and a common node, a second signal path coupled between a second intermediate node and the common node, first resonator circuitry coupled between the first signal path and ground, and second resonator circuitry coupled between the second signal path and ground. The first resonator circuitry is configured to allow signals within a first frequency pass band to pass between the first intermediate node and the common node, while attenuating signals outside of the first frequency pass band. The first resonator circuitry includes a first LC resonator. The second resonator circuitry is configured to allow signals within a second frequency pass band to pass between the second intermediate node and the common node, while attenuating signals outside of the second frequency pass band.

20 Claims, 13 Drawing Sheets

RADIO FREQUENCY FILTERING CIRCUITRY WITH RESONATORS

RELATED APPLICATIONS

This application claims the benefit of U.S. provisional patent application No. 62/074,452, filed Nov. 3, 2014, the disclosure of which is incorporated herein by reference in its entirety.

FIELD OF THE DISCLOSURE

The present disclosure relates to radio frequency (RF) filtering circuitry, and specifically to RF filtering circuitry including one or more resonators.

BACKGROUND

Radio frequency (RF) filtering circuitry is essential to the operation of modern wireless communications devices. In addition to reducing distortion present in RF transmit and receive signals, RF filtering circuitry is also used to separate and combine RF signals in different frequency bands such that multiple RF signals can be simultaneously transmitted and received from a single antenna. One type of RF filtering circuitry often used for this task is RF multiplexer circuitry. FIG. 1 shows a conventional RF multiplexer 10. The conventional RF multiplexer 10 includes a common node 12, a number of input/output nodes 14, and RF filtering circuitry 16 coupled between the common node 12 and the input/output nodes 14. Generally, the common node 12 of the conventional RF multiplexer 10 is coupled to an antenna, while each one of the input/output nodes 14 are coupled to RF front end circuitry. RF receive signals from the antenna are provided at the common node 12, where they are separated by the RF filtering circuitry 16 and passed to one of the input/output nodes 14. Each one of the input/output nodes 14 is associated with a particular frequency band such that each one of the input/output nodes 14 receives only the portion of the RF receive signals falling within their associated frequency band from the common node 12. This allows RF receive signals to be routed to low noise amplifier (LNA) circuitry in the RF front end circuitry that is optimized to operate within the particular frequency band, which improves the performance thereof. RF transmit signals provided from the RF front end circuitry to each one of the input/output nodes 14 are combined and passed to the common node 12, where they can then be transmitted from the antenna.

Generally, RF filtering circuitry can be divided into two categories:

acoustic filtering circuitry and electromagnetic filtering circuitry (that can be either lumped or distributed). FIG. 2 shows the conventional RF multiplexer 10 wherein the RF filtering circuitry 16 is acoustic filtering circuitry 18. Specifically, the RF filtering circuitry 16 is shown as a bulk acoustic wave (BAW) or a surface acoustic wave (SAW) filter.

To implement the conventional RF multiplexer 10, the acoustic filtering circuitry 18 must provide a filter response configured to pass the particular frequency bands associated with each input/output node 14. For the RF multiplexer 10 shown in FIG. 1, this means providing a filter response with a bandpass for six different frequency bands. Due to size constraints associated with mobile devices, the acoustic filtering circuitry 18 is generally implemented on a single module. As the number of desired pass bands gets larger and stop bands are needed to ensure good isolation between bands, the complexity of the acoustic filtering circuitry 18 increases substantially. The number of frequency bands that can be separated by conventional acoustic circuitry 18 is therefore limited.

Acoustic filtering circuitry generally has a relatively high quality factor (Q), however, the bandwidth thereof is generally limited. This is due to the fact that as the bandwidth of acoustic filtering circuitry is increased, an undesirable filter response known as "flyback" is also increased. To illustrate this effect, FIG. 3 is a graph showing an exemplary portion of a filter response of acoustic filtering circuitry. As shown in FIG. 3, the acoustic filtering circuitry exhibits a bandpass response 20 with very steep roll-off (due to the high quality factor thereof). However, even for a relatively narrow bandpass response, the filter response shows significant flyback 22. This amount of flyback is generally proportional to the number of acoustic filters sharing a common node. The flyback associated with acoustic filtering circuitry with a large number of filter responses therefore generally limits the achievable bandwidth thereof. As wireless communications standards continue to incorporate additional bands that span across a wide range of frequencies, and as carrier aggregation configurations in which wireless communications circuitry is required to simultaneously utilize these different bands, become more widely accepted, the constrained bandwidth of acoustic filtering circuitry has become problematic.

Electromagnetic filtering circuitry has thus been used to achieve wider bandwidths in wireless communications circuitry. FIG. 4 shows the conventional RF multiplexer 10 wherein the RF filtering circuitry 16 is electromagnetic in the form of lumped LC filtering circuitry 24. The LC filtering circuitry 24 includes a number of inductors 26 and a number of capacitors 28 coupled between the common node 12 and the input/output nodes 14. While the LC filtering circuitry 24 provides a much wider bandwidth than the acoustic filtering circuitry 18, a wide bandwidth is generally associated with higher loading along the signal path of the filtering circuitry. This generally results in a significant reduction in the quality factor of the LC filtering circuitry 24. Such a reduction in quality factor can result in relatively poor isolation between adjacent bands to be separated by the LC filtering circuitry. This is illustrated in FIG. 5. FIG. 5 shows a first bandpass filter response 30 and a second bandpass filter response 32 that are adjacent to one another. Within each bandpass filter response, a number of sub-bands are shown, labeled A through N. While each one of the first bandpass filter response 30 and the second bandpass filter response 32 has a relatively wide bandwidth, due to the relatively low quality factor associated with active filtering devices, the roll-off of each bandpass filter response is quite gradual. This results in significant overlap between the first bandpass filter response 30 and the second bandpass filter response 32, which translates to poor isolation between the pass bands. Specifically, this overlap often results in leakage of undesirable signals into a signal path in wireless communications circuitry, which can cause distortion, desensitization, and even damage to one or more components therein. This may be especially problematic in carrier aggregation applications in which two bordering sub-bands from each filter response are used. For example, in a carrier aggregation application in which signals are transmitted on band G and received on band H, a significant portion of the band G signals will likely leak into the signal path for band H, and vice versa.

In light of the above, there is a need for RF filtering circuitry with improved performance. Specifically, there is a need for RF filtering circuitry with improvements to the quality factor and bandwidth thereof.

SUMMARY

The present disclosure relates to radio frequency (RF) filtering circuitry, and specifically to RF filtering circuitry including one or more resonators. In one embodiment, RF multiplexer circuitry includes a first signal path coupled between a first intermediate node and a common node, a second signal path coupled between a second intermediate node and the common node, first resonator circuitry coupled between the first signal path and ground, and second resonator circuitry coupled between the second signal path and ground. The first resonator circuitry is configured to allow signals within a first frequency pass band to pass between the first intermediate node and the common node, while attenuating signals outside of the first frequency pass band. The first resonator circuitry includes a first LC resonator and a second LC resonator. The second resonator circuitry is configured to allow signals within a second frequency pass band to pass between the second intermediate node and the common node, while attenuating signals outside of the second frequency pass band. The second resonator circuitry includes a third LC resonator and a fourth LC resonator. The first LC resonator and the second LC resonator are electromagnetically coupled such that a coupling factor between the first LC resonator and the second LC resonator is between about 1.0% and 40.0% (i.e., between about 0.01 and 0.4). The third LC resonator and the fourth LC resonator are electromagnetically coupled such that a coupling factor between the third LC resonator and the fourth LC resonator is between about 1.0% and 40.0% (i.e., between about 0.01 and 0.4). Providing the first LC resonator and the second LC resonator such that they are electromagnetically coupled as discussed above results in a sharper roll-off and increased bandwidth of the first frequency pass band and the second frequency pass band.

In one embodiment, the quality factor of the first resonator circuitry and the second resonator circuitry is between about 10 and 300.

The first LC resonator may be electromagnetically coupled to the third LC resonator such that a coupling factor between the first LC resonator and the third LC resonator is between about 1.0% and 40.0% (i.e., between about 0.01 and 0.04). Providing the first LC resonator and the third LC resonator such that they are electromagnetically coupled as discussed above results in re-combination of leakage signals within a secondary signal path with the primary signal path, thereby increasing isolation in the RF multiplexer circuitry.

Coupling capacitors may be coupled between the various resonators and the nodes of the RF multiplexer circuitry.

In one embodiment, the resonator control circuitry is configured to adjust the capacitances of the various capacitors in the RF multiplexer circuitry such that the first frequency pass band and the second frequency pass band overlap in a carrier aggregation mode, and do not overlap in a standard mode.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Figure 6:
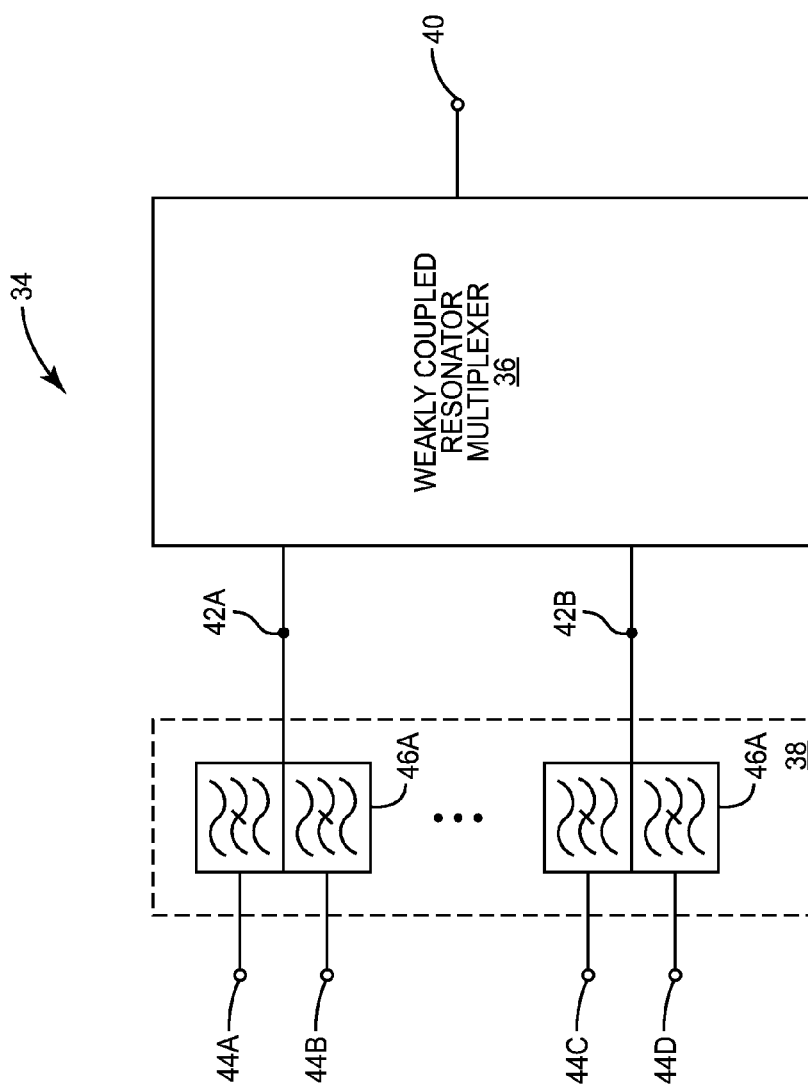
FIG. 6 is a functional schematic of RF filtering circuitry according to one embodiment of the present disclosure.

FIG. 6 shows RF filtering circuitry 34 according to one embodiment of the present disclosure. The RF filtering circuitry 34 includes resonator multiplexer circuitry 36 and supplemental filtering circuitry 38. The resonator multiplexer circuitry 36 is coupled between a common node 40, a first intermediate node 42A, and a second intermediate node 42B. The supplemental filtering circuitry 38 is coupled between the first intermediate node 42A, the second intermediate node 42B, a first input/output node 44A, a second input/output node 44B, a third input/output node 44C, and a fourth input/output node 44D. Specifically, the supplemental filtering circuitry 38 includes a first supplemental filter 46A coupled between the first intermediate node 42A, the first input/output node 44A, and the second input/output node 44B, and a second supplemental filter 46B coupled between the second intermediate node 42B, the third input/output node 44C, and the fourth input/output node 44D. Notably, the particular number of intermediate nodes 42, input/output nodes 44, and supplemental filters 46 are merely exemplary. The RF filtering circuitry 34 may include any number of intermediate nodes 42, input/output nodes 44, and supplemental filters 46 without departing from the principles of the present disclosure.

In operation, signals provided at the common node 40 are separated into a first frequency pass band and a second frequency pass band and separately delivered to the first intermediate node 42A and the second intermediate node 42B, respectively. Signals within the first frequency pass band are then separated again into a first sub-band and a second sub-band by the first supplemental filter 46A. Signals within the second frequency pass band are similarly separated again into a third sub-band and a fourth sub-band by the second supplemental filter 46B. In one embodiment, the first frequency pass band and the second frequency pass band include multiple operating bands, while the first sub-band, the second sub-band, the third sub-band, and the fourth sub-band include only a single operating band, where an operating band is a single band used for communication (e.g., a single long term evolution (LTE) operating band). Accordingly, the resonator multiplexer circuitry 36 provides filtering having a coarse granularity, while the supplemental filtering circuitry 38 provides filtering at a finer granularity.

In one embodiment, the resonator multiplexer circuitry 36 is configured to provide a relatively wide bandwidth, while the supplemental filtering circuitry 38 provides high selectivity (e.g., via a higher quality factor). To accomplish this, the resonator multiplexer circuitry 36 may include multiple resonators (including a number of inductors and capacitors), while the supplemental filtering circuitry 38 may include a number of acoustic filters. In particular, the resonator multiplexer circuitry 36 may include at least two resonators, which are coupled to one another such that a coupling factor between the at least two resonators is between about 0.1% and 40.0% (i.e., between about 0.01 and 0.4). As discussed in detail below, this improves the loaded quality factor of the resonator multiplexer circuitry 36, such that the quality factor of the resonator multiplexer circuitry 36 may be between about 10 and 300. However, further improvements may be made by using acoustic filters for the first supplemental filter 46A and the second supplemental filter 46B. The present disclosure is not limited to the use of acoustic filters in the supplemental filtering circuitry 38. Any suitable filters may be used for the first supplemental filter 46A and the second supplemental filter 46B without departing from the principles of the present disclosure.

Figure 7:
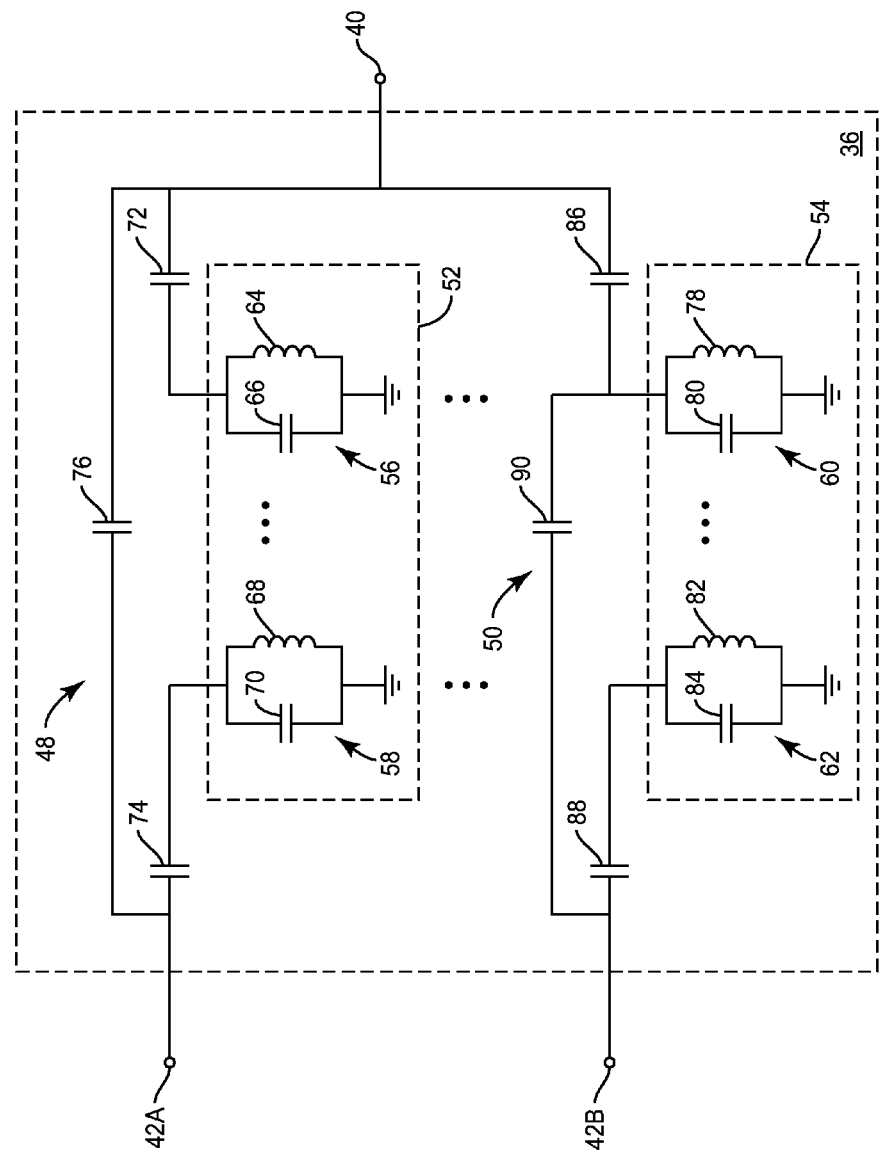
FIG. 7 is a functional schematic of resonator RF multiplexer circuitry according to one embodiment of the present disclosure.

FIG. 7 shows details of the resonator multiplexer circuitry 36 according to one embodiment of the present disclosure. The resonator multiplexer circuitry 36 includes a first signal path 48 coupled between the first intermediate node 42A and the common node 40, a second signal path 50 coupled between the second intermediate node 42B and the common node 40, first resonator circuitry 52 coupled between the first signal path 48 and ground, and second resonator circuitry 54 coupled between the second signal path 50 and ground. The first resonator circuitry 52 includes a first LC resonator 56 and a second LC resonator 58 coupled between the first signal path 48 and ground. The second resonator circuitry 54 includes a third LC resonator 60 and a fourth LC resonator 62 coupled between the second signal path 50 and ground. The first LC resonator 56 includes a first resonator inductor 64 and a first resonator capacitor 66 coupled in parallel between the first signal path 48 and ground. The second LC resonator 58 includes a second resonator inductor 68 and a second resonator capacitor 70 coupled between the first signal path 48 and ground. The first signal path 48 includes a first coupling capacitor 72 coupled between the common node 40 and the first LC resonator 56, a second coupling capacitor 74 coupled between the first intermediate node 42A and the second LC resonator 58, and a third coupling capacitor 76 coupled between the common node 40 and the first intermediate node 42A. The third LC resonator 60 includes a third resonator inductor 78 and a third resonator capacitor 80 coupled between the second signal path 50 and ground. The fourth LC resonator 62 includes a fourth resonator inductor 82 and a fourth resonator capacitor 84 coupled between the second signal path 50 and ground. The second signal path 50 includes a fourth coupling capacitor 86 coupled between the common node 40 and the third LC resonator 60, a fifth coupling capacitor 88 coupled between the second intermediate node 42B and the fourth LC resonator 62, and a sixth coupling capacitor 90 coupled between the common node 40 and the third LC resonator 60.

In operation, the first LC resonator 56, the second LC resonator 58, the third LC resonator 60, and the fourth LC resonator 62 are configured to resonate at different frequencies. When resonating, the resonators present a very high impedance to their respective signal paths. This effectively allows signals within a first frequency band to pass between the common node 40 and the first intermediate node 42A, and signals within a second frequency band to pass between the common node 40 and the second intermediate node 42B. When the resonators are not resonating, the impedance presented thereby is significantly lower, thereby shunting signals outside of the first frequency band and the second frequency band, respectively, to ground.

The first LC resonator 56 is electromagnetically coupled to the second LC resonator 58 such that a coupling factor between the first LC resonator 56 and the second LC resonator 58 is between about 1.0% and 40.0% (i.e., between about 0.01 and 0.40). The third LC resonator 60 is electromagnetically coupled to the fourth LC resonator 62 such that a coupling factor between the third LC resonator 60 and the fourth LC resonator 62 is between about 1.0% and 40.0% (i.e., between about 0.01 and 0.40). The first LC resonator 56 and the third LC resonator 60 are electromagnetically coupled such that a coupling factor between the first LC resonator 56 and the third LC resonator 60 is between about 1.0% and 40.0% (i.e., between about 0.01 and 0.40). The second LC resonator 58 and the fourth LC resonator 62 are not electromagnetically coupled such that a coupling factor between the second LC resonator 58 and the fourth LC resonator 62 is less than about 1.0%. Similarly, the first LC resonator 56 and the fourth LC resonator 62 are not electromagnetically coupled such that a coupling factor between the first LC resonator 56 and the fourth LC resonator 62 is less than about 1.0%.

As discussed above, providing coupling between the first LC resonator 56 and the second LC resonator 58, and providing coupling between the third LC resonator 60 and the fourth LC resonator 62 effectively widens the bandwidth of the resonator multiplexer circuitry 36 along each signal path, and further increases the sharpness of the roll-off thereof. Providing coupling between the first LC resonator 56 and the third LC resonator 60 allows a portion of leakage signals coupled into each secondary signal path to be effectively re-combined with the primary signal path, thereby increasing the isolation of the resonator multiplexer circuitry 36.

While only four LC resonators are shown in the resonator multiplexer circuitry 36, any number of LC resonators may be used without departing from the principles of the present disclosure. Adding additional LC resonators to the resonator multiplexer circuitry 36 may widen the pass band of each signal path by adding a resonant response at a nearby frequency to pass additional signals. As discussed above, due to the weak coupling between the LC resonators, the bandwidth and roll-off of the filter response thereof is sharpened, which increases the performance thereof.

Figure 8:
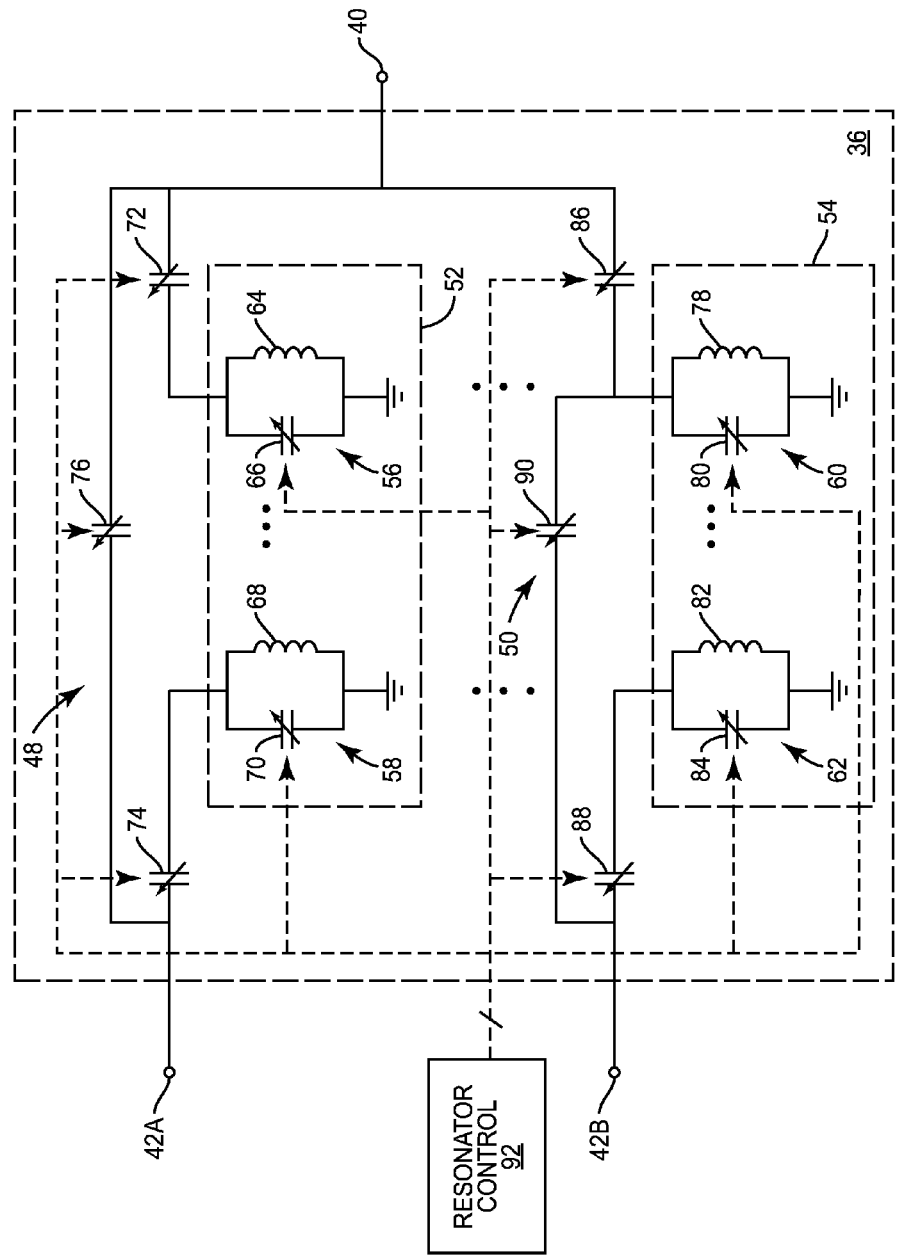
FIG. 8 is a functional schematic of resonator RF multiplexer circuitry according to one embodiment of the present disclosure.

FIG. 8 shows the resonator multiplexer circuitry 36 according to an additional embodiment of the present disclosure. The resonator multiplexer circuitry 36 shown in FIG. 8 is substantially similar to that shown in FIG. 7, but further includes resonator control circuitry 92. Further, the first resonator capacitor 66, the second resonator capacitor 70, the third resonator capacitor 80, the fourth resonator capacitor 84, the first coupling capacitor 72, the second coupling capacitor 74, the third coupling capacitor 76, the fourth coupling capacitor 86, the fifth coupling capacitor 88, and the sixth coupling capacitor 90 are adjustable. The resonator control circuitry 92 is coupled to the first resonator capacitor 66, the second resonator capacitor 70, the third resonator capacitor 80, the fourth resonator capacitor 84, the first coupling capacitor 72, the second coupling capacitor 74, the third coupling capacitor 76, the fourth coupling capacitor 86, the fifth coupling capacitor 88, and the sixth coupling capacitor 90 in order to adjust a capacitance thereof. Adjusting a capacitance of one or more of the first resonator capacitor 66, the second resonator capacitor 70, the third resonator capacitor 80, the fourth resonator capacitor 84, the first coupling capacitor 72, the second coupling capacitor 74, the third coupling capacitor 76, the fourth coupling capacitor 86, the fifth coupling capacitor 88, and the sixth coupling capacitor 90 adjusts the resonant frequency of the first LC resonator 56, the second LC resonator 58, the third LC resonator 60, and the fourth LC resonator 62, as well as the coupling factors between the resonators. Accordingly, the filter response of the resonator multiplexer circuitry 36 may be adjusted as desired.

Figure 9:
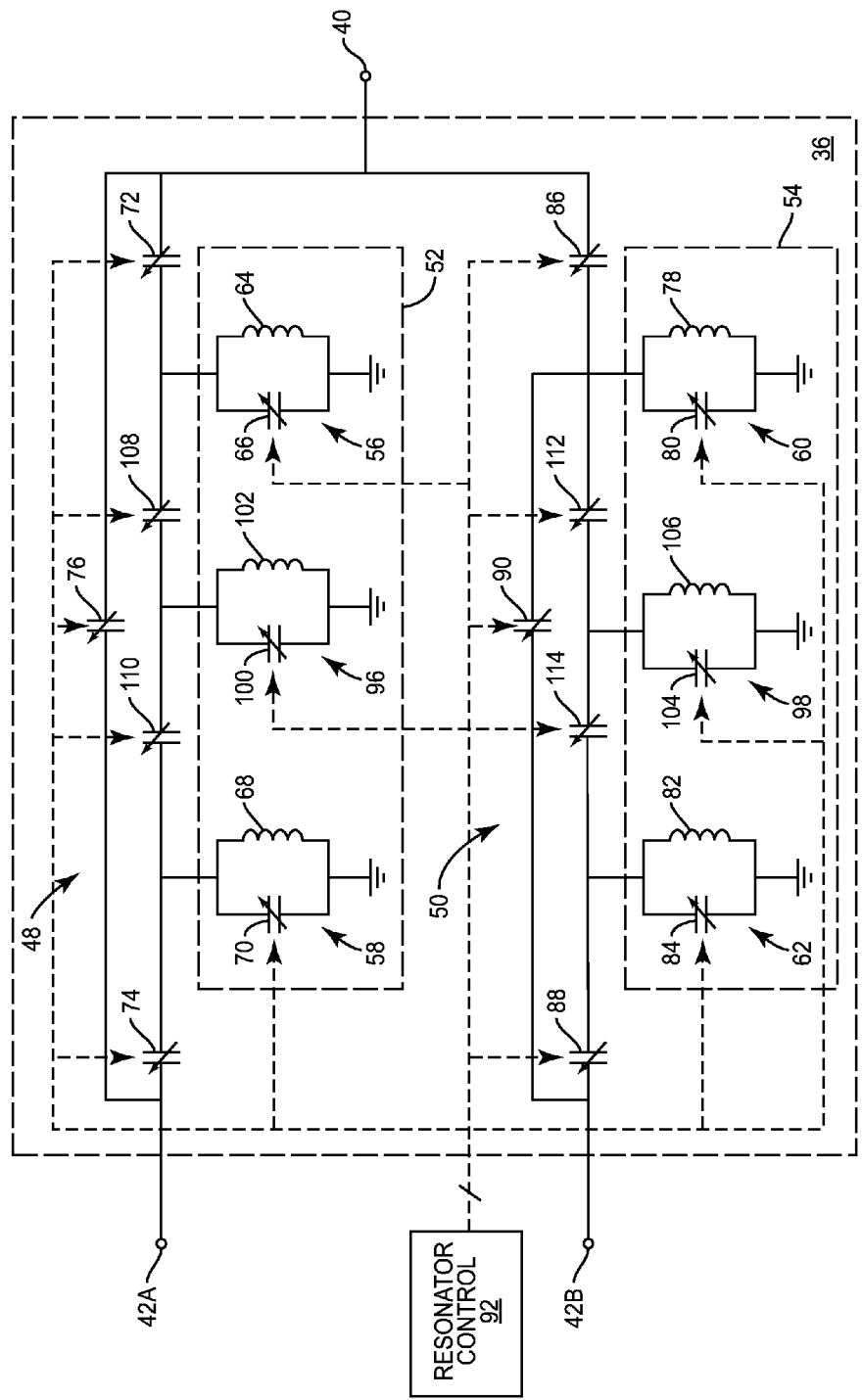
FIG. 9 is a functional schematic of resonator RF multiplexer circuitry according to one embodiment of the present disclosure.

FIG. 9 shows the resonator multiplexer circuitry 36 according to an additional embodiment of the present disclosure. The resonator multiplexer circuitry 36 shown in FIG. 9 is substantially similar to that shown in FIG. 8, but further includes a fifth LC resonator 96 coupled between the first signal path 48 and ground and a sixth LC resonator 98 coupled between the second signal path 50 and ground. The fifth LC resonator 96 includes a fifth resonator capacitor 100 and a fifth resonator inductor 102 coupled in parallel between the first signal path 48 and ground. The sixth LC resonator 98 includes a sixth resonator capacitor 104 and a sixth resonator inductor 106 coupled in parallel between the second signal path 50 and ground. A seventh coupling capacitor 108 may couple the first LC resonator 56 to the fifth LC resonator 96. An eighth coupling capacitor 110 may couple the second LC resonator 58 to the fifth LC resonator 96. A ninth coupling capacitor 112 may couple the third LC resonator 60 to the sixth LC resonator 98. A tenth coupling capacitor 114 may couple the fourth LC resonator 62 to the sixth LC resonator 98. The resonator control circuitry 92 may be coupled to each one of the first resonator capacitor 66, the second resonator capacitor 70, the third resonator capacitor 80, the fourth resonator capacitor 84, the fifth resonator capacitor 100, the sixth resonator capacitor 104, the first coupling capacitor 72, the second coupling capacitor 74, the third coupling capacitor 76, the fourth coupling capacitor 86, the fifth coupling capacitor 88, the sixth coupling capacitor 90, the seventh coupling capacitor 108, the eighth coupling capacitor 110, the ninth coupling capacitor 112, and the tenth coupling capacitor 114 to adjust the response of the resonator multiplexer circuitry 36 as described above.

Figure 1:
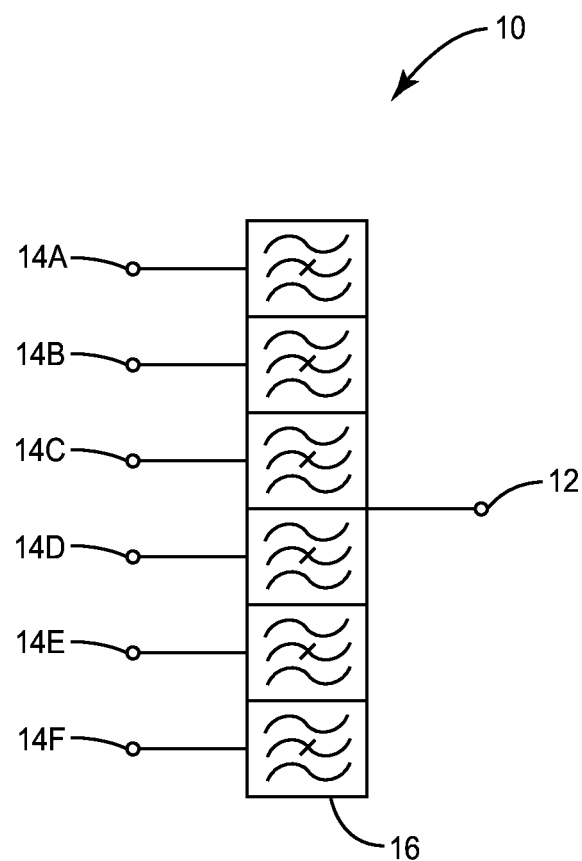
FIG. 1 is a functional schematic of conventional radio frequency (RF) multiplexer circuitry.
Figure 2:
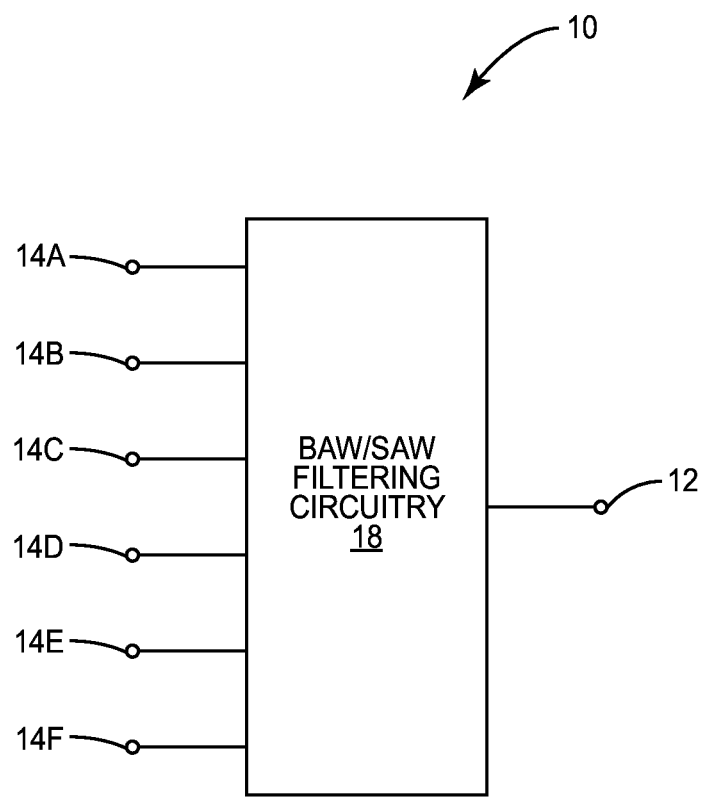
FIG. 2 is a functional schematic of conventional RF multiplexer circuitry including acoustic filtering circuitry.
Figure 3:
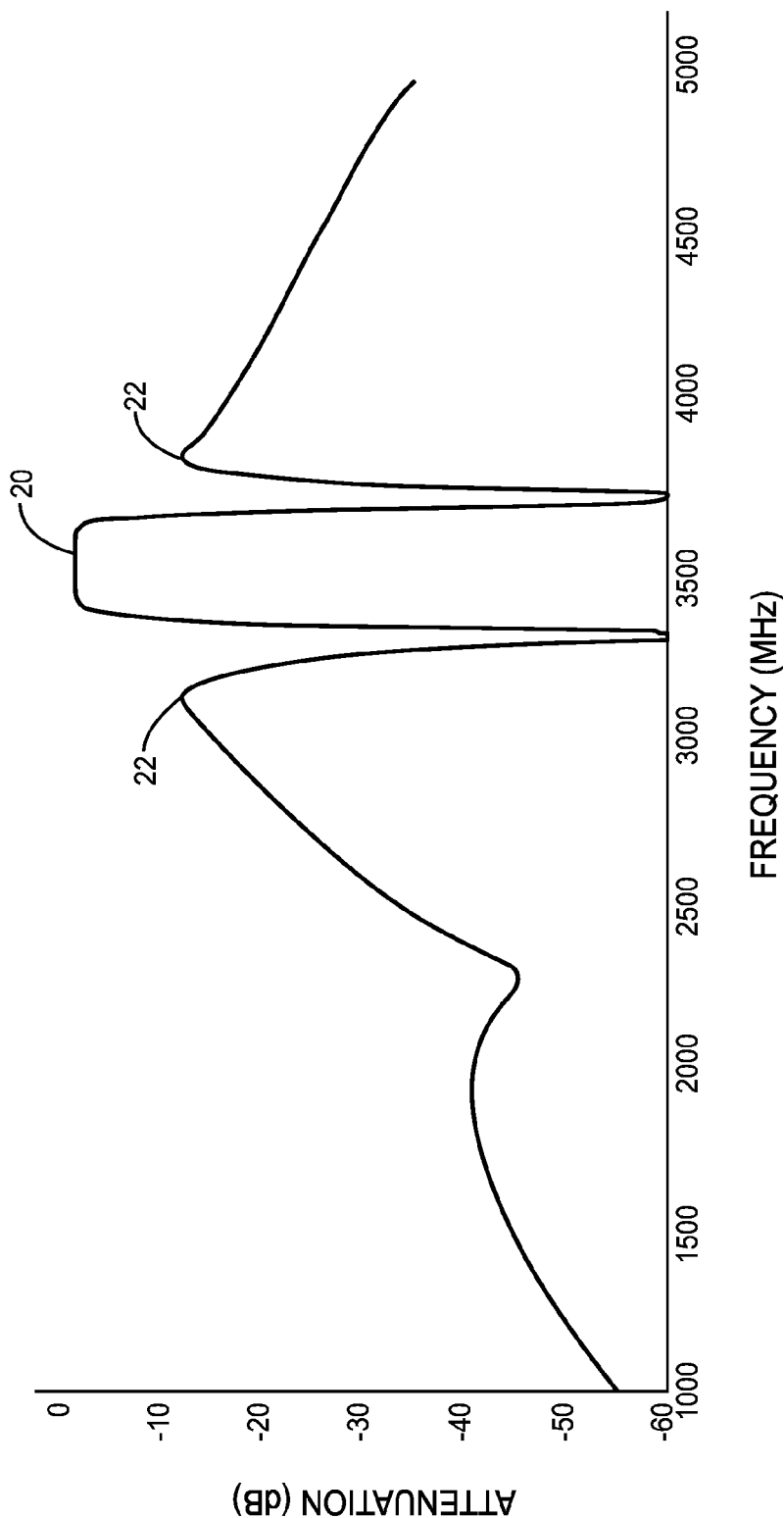
FIG. 3 is a graph illustrating a filter response of acoustic filtering circuitry.
Figure 4:
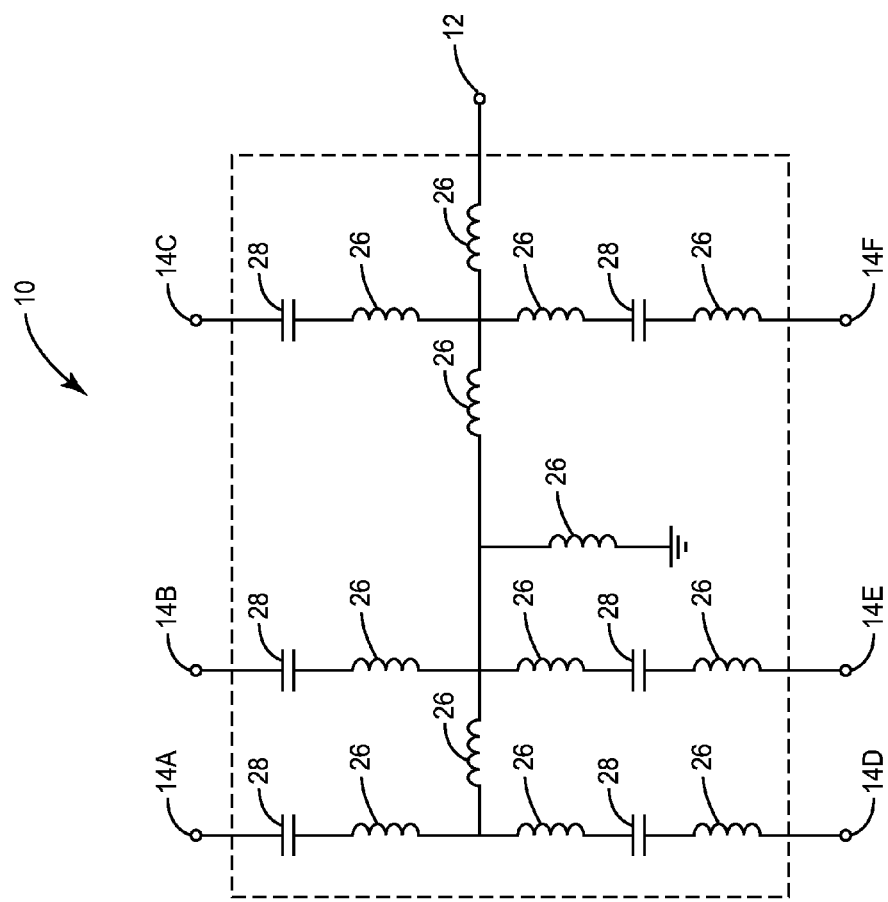
FIG. 4 is a functional schematic of conventional RF multiplexer circuitry including electromagnetic filtering circuitry.
Figure 5:
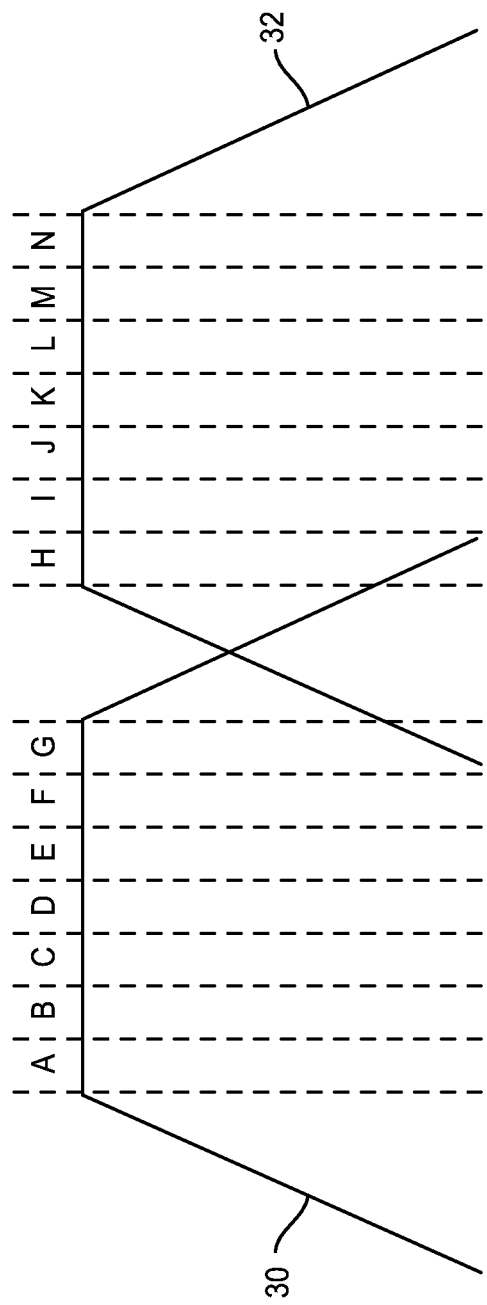
FIG. 5 is a graph illustrating a filter response of electromagnetic filtering circuitry.
Figure 10A:
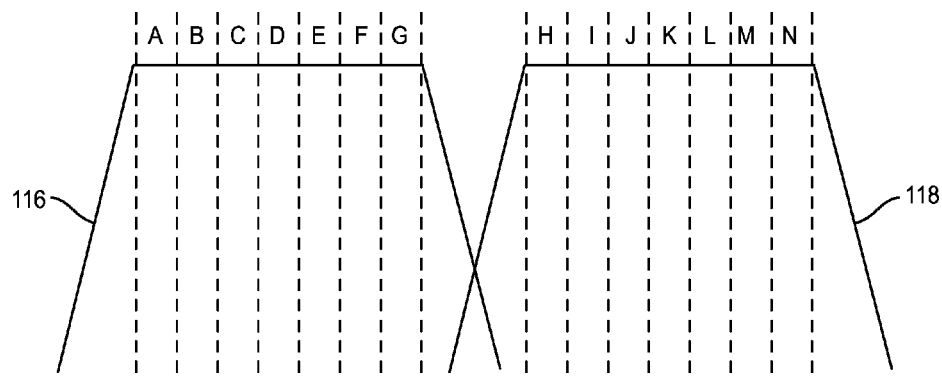
FIGS. 10A through 10C are graphs illustrating a filter response of resonator RF multiplexer circuitry according to one embodiment of the present disclosure.

FIG. 10A shows an exemplary filter response of the resonator multiplexer circuitry 36 according to one embodiment of the present disclosure. As shown in FIG. 10A, a first frequency pass band 116 and a second frequency pass band 118 are provided adjacent to one another. A number of sub-bands in each one of the first frequency pass band 116 and the second frequency pass band 118 are labeled A through N. Notably, the roll-off of the first frequency pass band 116 and the second frequency pass band 118 are significantly sharper than those shown above in FIG. 5. This is due to the weak coupling between the LC resonators therein, and in particular the coupling between the first LC resonator 56 and the second LC resonator 58 and the coupling between the third LC resonator 60 and the fourth LC resonator 62, as well as the third coupling capacitor 76 and the sixth coupling capacitor 90, which create a number of notches in the filter response. Due to the steeper roll-off, there is less overlap between the first frequency pass band 116 and the second frequency pass band 118. However, due to inherent limitations in electromagnetic filtering circuitry, there is still some overlap. In some situations, this overlap may reduce the performance of a wireless communications device by introducing distortion from undesired frequency bands into a particular signal path. In particular, this may result in leakage of powerful transmission signals into a relatively low-power receive path, which may in turn desensitize receiver circuitry in the signal path. Such a scenario is especially prevalent when, for example, band G and band H are used together in a carrier aggregation configuration. As discussed above, due to the overlap in the first frequency pass band 116 and the second frequency pass band 118, a portion of signals from band G and band H will be cross-coupled. When both of band G and band H must be used simultaneously, such a result may be unavoidable. However, for all other configurations, the likelihood of distortion may be reduced.

Figure 10B:
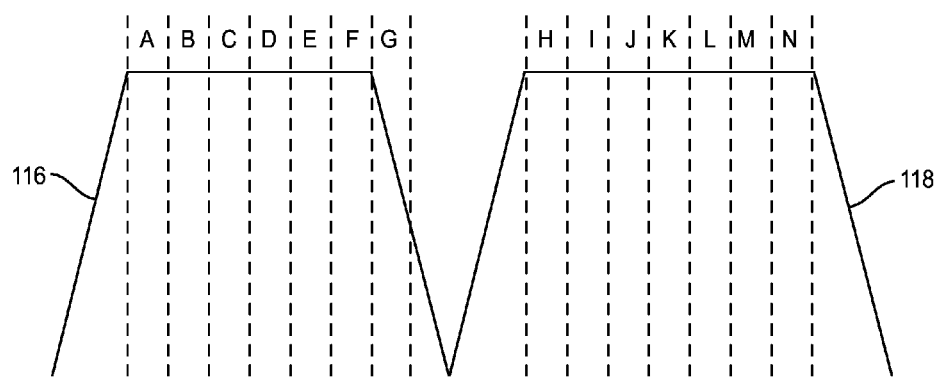

FIG. 10B thus shows a filter response of the resonator multiplexer circuitry 36 according to an additional embodiment of the present disclosure. In particular, FIG. 10B shows a filter response in which the components in the resonator multiplexer circuitry 36 have been adjusted to reduce the bandwidth of the first frequency pass band 116 to increase the isolation between the first frequency pass band 116 and the second frequency pass band 118. In such an embodiment, the first frequency pass band 116 and the second frequency pass band 118 no longer overlap. The increased isolation afforded by such an approach comes at the cost of significantly reduced performance in band G due to a much higher insertion loss. However, such an approach will generally be used when, for example, band G is not in use. The resonator control circuitry discussed above with respect to FIG. 8 and FIG. 9 can dynamically change between the filter response shown in FIG. 10A and the filter response shown in FIG. 10B as desired.

Figure 10C:
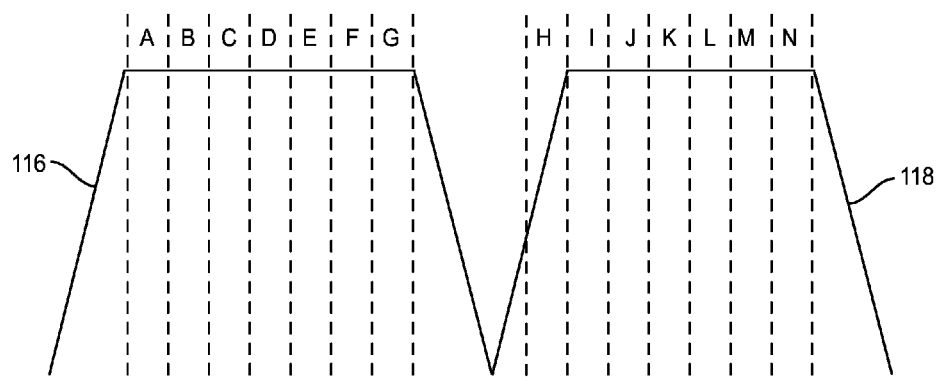

FIG. 10C shows a filter response of the resonator multiplexer circuitry 36 according to an additional embodiment of the present disclosure. The frequency response shown in FIG. 10C is similar to that shown in FIG. 10B, except that the bandwidth of the second frequency pass band 118 is reduced to increase isolation between the first frequency pass band 116 and the second frequency pass band 118. As discussed above, this may come at the cost of significantly decreased performance in band H due to increased insertion loss. However, the resonator control circuitry discussed above with respect to FIG. 8 and FIG. 9 can dynamically change between the filter responses in FIG. 10A, FIG. 10B, and FIG. 10C in order to implement the increased isolation response only when band G or band H is not in use.

Figure 11:
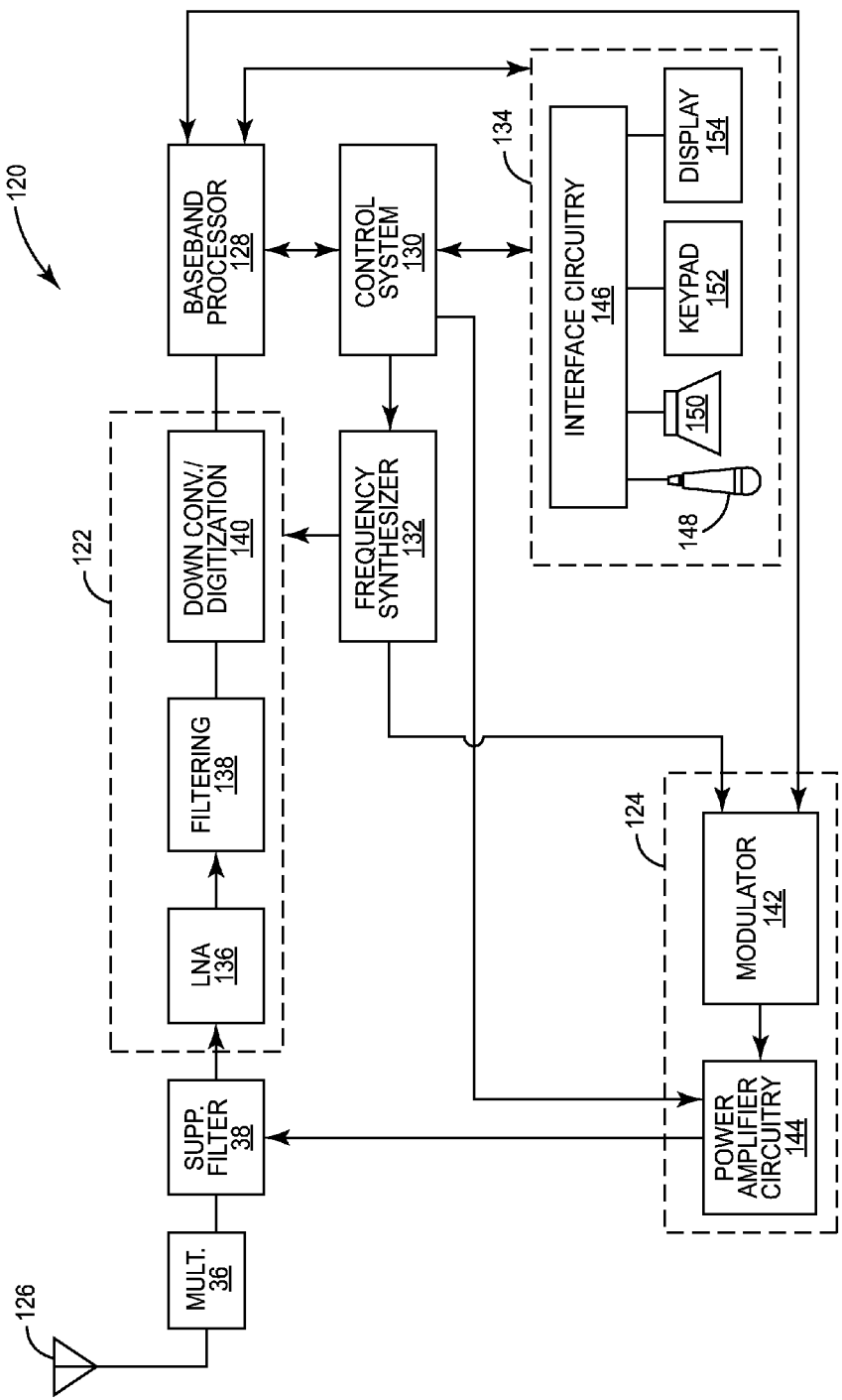
FIG. 11 is a functional diagram of a wireless communications device including RF filtering circuitry according to one embodiment of the present disclosure.

FIG. 11 shows a wireless communications device 120 including the RF filtering circuitry 34 according to one embodiment of the present disclosure. The wireless communications device 120 may be a mobile telephone, personal digital assistant (PDA), or the like. The basic architecture of the wireless communications device 120 may include the resonator multiplexer circuitry 36, the supplemental filtering circuitry 38, a receiver front end 122, an RF transmitter section 124, an antenna 126, a baseband processor 128, a control system 130, a frequency synthesizer 132, and an interface 134. The receiver front end 122 receives information bearing RF signals from one or more remote transmitters provided by a base station via the resonator multiplexer circuitry 36 and the supplemental filtering circuitry 38. A low noise amplifier (LNA) 136 amplifies the signal. While only one LNA 136 is shown to avoid obscuring the drawings, multiple LNAs 136 are generally provided, each designed to process signals within a specific frequency range. Accordingly, signals from different outputs of the resonator multiplexer circuitry 36 and the supplemental filtering circuitry 38 (also not shown for purposes of clarity) will generally be provided to different LNAs 136 in the receiver front end 122. Additional filtering circuitry 138 minimizes broadband interference in the received signal, while a down-converter 140 down-converts the filtered received signal to an intermediate or baseband frequency signal, which is then digitized into one or more digital streams. The receiver front end 122 typically uses one or more mixing frequencies generated by the frequency synthesizer 132.

The baseband processor 128 processes the digitized received signal to extract the information or data bits conveyed in the received signal. This processing typically comprises demodulation, decoding, and error correction operations. As such, the baseband processor 128 is generally implemented in one or more digital signal processors (DSPs).

On the transmit side, the baseband processor 128 receives digitized data from the control system 130, which it encodes for transmission. The encoded data is output to the RF transmitter section 124 where it is used by a modulator 142 to modulate a carrier signal that is at a desired transmit frequency. Power amplifier circuitry 144 amplifies the modulated carrier signal to a level appropriate for transmission from the antenna 126. The signals are then provided through the supplemental filtering circuitry 38 and the resonator multiplexer circuitry 36. Generally, the power amplifier circuitry 144 includes multiple power amplifiers, the signals from which may be simultaneously provided to the supplemental filtering circuitry 38 and the resonator multiplexer circuitry 36 simultaneously, where they are combined for transmission from the antenna 126.

A user may interact with the wireless communications device 120 via the interface 134 which may include interface circuitry 146 associated with a microphone 148, a speaker 150, a keypad 152, and a display 154. The interface circuitry 146 typically includes analog-to-digital converters, digital-to-analog converters, amplifiers, and the like. Additionally, it may include a voice encoder/decoder, in which case it may communicate directly with the baseband processor 128.

The microphone 148 will typically convert audio input, such as the user's voice, into an electrical signal, which is then digitized and passed directly or indirectly to the baseband processor 128. Audio information encoded in the received signal is recovered by the baseband processor 128 and converted by the interface circuitry 146 into an analog signal suitable for driving the speaker 150. The keypad 152 and the display 154 enable the user to interact with the wireless communications device 120 by inputting numbers to be dialed, address book information, or the like, as well as monitoring call progress information.

Figure 12A:
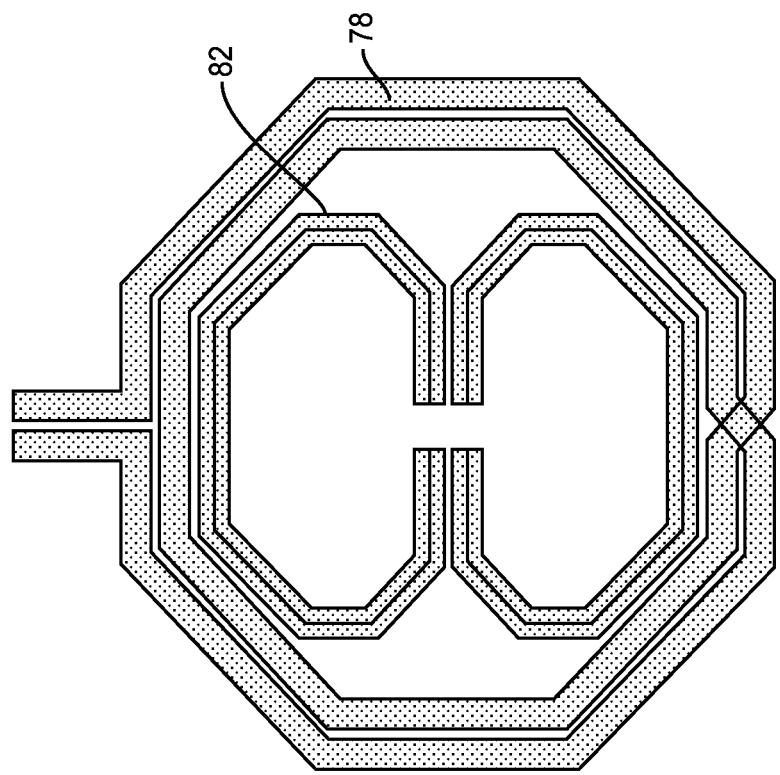
FIGS. 12A and 12B illustrate various configurations for resonator inductors used in resonator multiplexer circuitry according to one embodiment of the present disclosure.
Figure 12A:
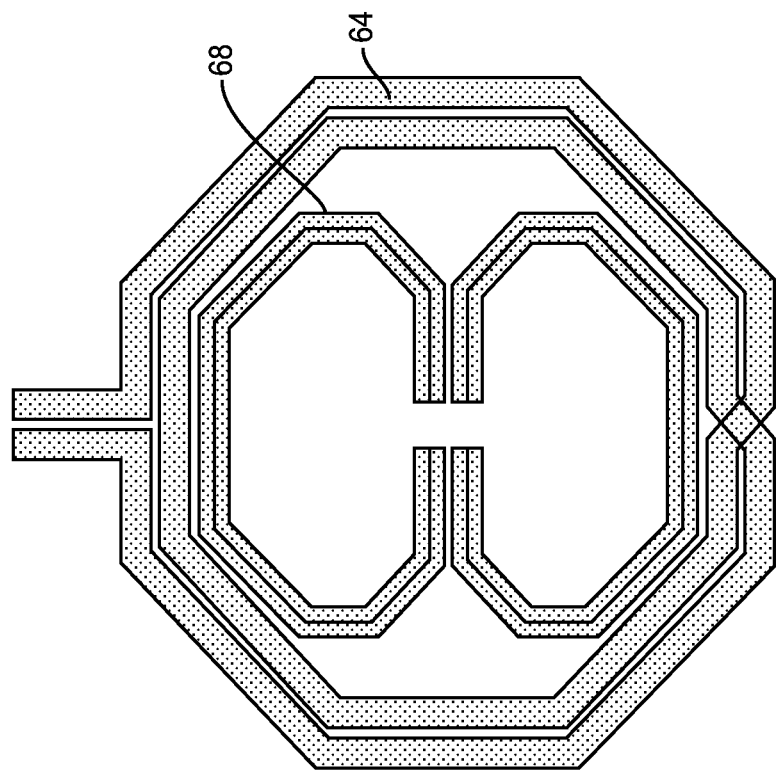
Figure 12B:
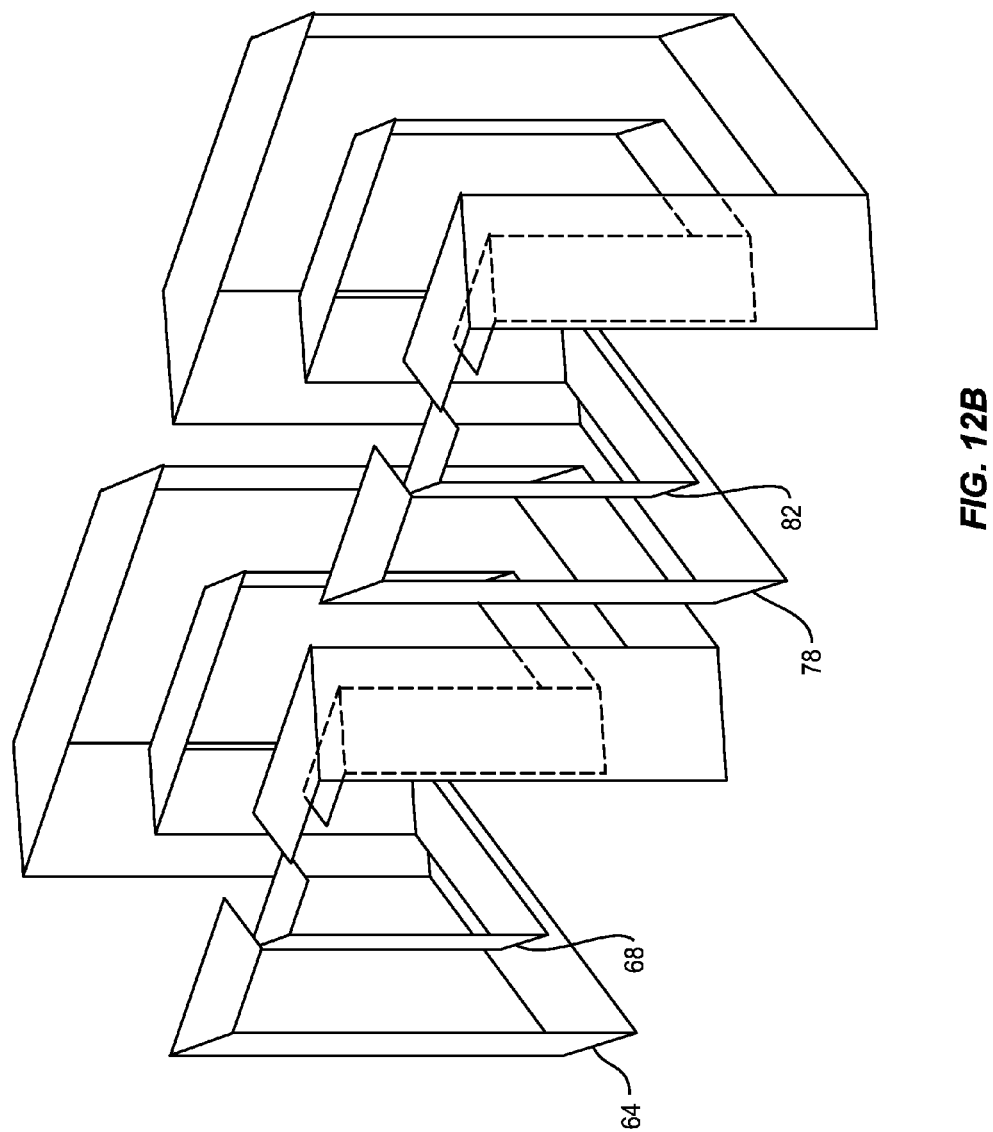

As discussed above, the coupling between the various LC resonators in the resonator multiplexer circuitry 36 may be achieved via specific placement of the inductors in the resonators. FIGS. 12A and 12B illustrate various configurations for the first resonator inductor 64, the second resonator inductor 68, the third resonator inductor 78, and the fourth resonator inductor 82 shown in FIGS. 9 and 10. Specifically, FIG. 12A shows two nested two-dimensional inductors such that the second resonator inductor 68 and the fourth resonator inductor 82 are shaped like a figure "8", and the first resonator inductor 64 and the third resonator inductor 78 surround the second resonator inductor 68 and the fourth resonator inductor 82, respectively. Because the second resonator inductor 68 is surrounded by the first resonator inductor 64, and because the fourth resonator inductor 82 is surrounded by the third resonator inductor 78, electromagnetic coupling occurs between the respective inductors. Further, because the first resonator inductor 64 and the third resonator inductor 78 are adjacent to one another, they are also electromagnetically coupled. This increases the isolation of the resonator multiplexer circuitry 36 as discussed above. However, due to shielding provided by the first resonator inductor 64 and the third resonator inductor 78, the second resonator inductor 68 and the fourth resonator inductor 82 have minimal coupling with one another. Accordingly, the desired coupling factors between the first resonator inductor 64, the second resonator inductor 68, the third resonator inductor 78, and the fourth resonator inductor 82 may be achieved with a minimal footprint.

FIG. 12B shows the first resonator inductor 64 and the second resonator 68 as three-dimensional inductors wherein second resonator inductor 68 is nested inside of the first resonator inductor 64. Further, FIG. 12B shows the third resonator inductor 78 and the fourth resonator inductor 82 as three-dimensional inductors wherein the fourth resonator inductor 82 is nested inside of the third resonator inductor 78. Due to the three-dimensional structure of the first resonator inductor 64 and the third resonator inductor 78, the magnetic field of each inductor is substantially confined to an interior of the three-dimensional space bounded thereby. This results in coupling between the first resonator inductor 64 and the second resonator inductor 68 and coupling between the third resonator inductor 78 and the fourth resonator inductor 82. Further, due to the fact that the first resonator inductor 64 and the third resonator inductor 78 are adjacent to one another, and that not all of the magnetic field of each is confined to the interior thereof, a small amount of coupling will also occur between the first resonator inductor 64 and the third resonator inductor 78, which, as discussed above, results in cross-isolation between the first signal path 48 and the second signal path 50. Providing the first resonator inductor 64, the second resonator inductor 68, the third resonator inductor 78, and the fourth resonator inductor 82 as shown results in the ability to control the coupling factors there-between as desired while consuming minimal space with the inductors.

Those skilled in the art will recognize improvements and modifications to the embodiments of the present disclosure. All such improvements and modifications are considered within the scope of the concepts disclosed herein and the claims that follow.

What is claimed is:

1. Radio frequency (RF) multiplexer circuitry comprising:
a first signal path between a first intermediate node and a common node;
a second signal path between a second intermediate node and the common node;
first resonator circuitry connected between the first signal path and ground and configured to allow signals within a first frequency pass band to pass between the first intermediate node and the common node while attenuating signals outside of the first frequency pass band, the first resonator circuitry comprising a first LC resonator and a second LC resonator that is electromagnetically coupled with the first LC resonator such that a coupling factor between the first LC resonator and the second LC resonator is between about 1.0% and 40.0%; and
second resonator circuitry connected between the second signal path and ground and configured to allow signals within a second frequency pass band to pass between the second intermediate node and the common node while attenuating signals outside of the second frequency pass band, the second resonator circuitry comprising a third LC resonator and a fourth LC resonator that is electromagnetically coupled with the third LC resonator such that a coupling factor between the third LC resonator and the fourth LC resonator is between about 1.0% and 40.0%.

2. The RF multiplexer circuitry of claim 1 wherein a quality factor of the first resonator circuitry and the second resonator circuitry is between about 10 and 300.

3. The RF multiplexer circuitry of claim 1 wherein the first LC resonator is electromagnetically coupled to the third LC resonator such that a coupling factor between the first LC resonator and the third LC resonator is between about 1.0% and 40.0%.

4. The RF multiplexer circuitry of claim 3 wherein:
the second LC resonator is not electromagnetically coupled to the fourth LC resonator such that a coupling factor between the second LC resonator and the fourth LC resonator is less than about 1.0%; and
the first LC resonator is not electromagnetically coupled to the fourth LC resonator such that a coupling factor between the first LC resonator and the fourth LC resonator is less than about 1.0%.

5. The RF multiplexer circuitry of claim 4 wherein a quality factor of the first resonator circuitry and the second resonator circuitry is between about 10 and 300.

6. The RF multiplexer circuitry of claim 1 wherein:
the first signal path comprises:
a first coupling capacitor coupled between the common node and the first LC resonator;
a second coupling capacitor coupled between the first intermediate node and the second LC resonator; and
a third coupling capacitor coupled between the common node and the first intermediate node; and
the second signal path comprises:
a fourth coupling capacitor coupled between the common node and the third LC resonator;
a fourth coupling capacitor coupled between the second intermediate node and the fourth LC resonator; and
a sixth coupling capacitor coupled between the common node and the second intermediate node.

7. The RF multiplexer circuitry of claim 6 wherein:
the first LC resonator comprises a first resonator inductor and a first resonator capacitor coupled in parallel between the first signal path and ground;
the second LC resonator comprises a second resonator inductor and a second resonator capacitor coupled in parallel between the second signal path and ground;
the third LC resonator comprises a third resonator inductor and a third resonator capacitor coupled in parallel between the first signal path and ground; and
the fourth LC resonator comprises a fourth resonator inductor and a fourth resonator capacitor coupled in parallel between the second signal path and ground.

8. The RF multiplexer circuitry of claim 7 wherein one or more of the first coupling capacitor, the second coupling capacitor, the third coupling capacitor, the fourth coupling capacitor, the fifth coupling capacitor, the sixth coupling capacitor, the first resonator capacitor, the second resonator capacitor, the third resonator capacitor, and the fourth resonator capacitor are adjustable.

9. The RF multiplexer circuitry of claim 8 further comprising control circuitry configured to adjust a capacitance of one or more of the first coupling capacitor, the second coupling capacitor, the third coupling capacitor, the fourth coupling capacitor, the fifth coupling capacitor, the sixth coupling capacitor, the first resonator capacitor, the second resonator capacitor, the third resonator capacitor, and the fourth resonator capacitor in order to adjust one or more of the first frequency pass band and the second frequency pass band.

10. The RF multiplexer circuitry of claim 9 wherein:
in a carrier aggregation mode, the control circuitry is configured to adjust a capacitance of one or more of the first coupling capacitor, the second coupling capacitor, the third coupling capacitor, the fourth coupling capacitor, the fifth coupling capacitor, the sixth coupling capacitor, the first resonator capacitor, the second resonator capacitor, the third resonator capacitor, and the fourth resonator capacitor such that the first frequency pass band and the second frequency pass band overlap; and
in a standard mode, the control circuitry is configured to adjust a capacitance of one or more of the first coupling capacitor, the second coupling capacitor, the third coupling capacitor, the fourth coupling capacitor, the fifth coupling capacitor, the sixth coupling capacitor, the first resonator capacitor, the second resonator capacitor, the third resonator capacitor, and the fourth resonator capacitor such that there is no overlap between the first frequency pass band and the second frequency pass band.

11. Radio frequency (RF) filtering circuitry comprising:
multiplexer circuitry comprising:
a first signal path between a first intermediate node and a common node;
a second signal path between a second intermediate node and the common node;
first resonator circuitry coupled between the first signal path and ground and configured to allow signals within a first frequency pass band to pass between the first intermediate node and the common node while attenuating signals outside of the first frequency pass band, the first resonator circuitry comprising a first LC resonator and a second LC resonator that is electromagnetically coupled with the first LC resonator such that a coupling factor between the first LC resonator and the second LC resonator is between about 1.0% and 40.0%;
second resonator circuitry coupled between the second signal path and ground and configured to allow signals within a second frequency pass band to pass between the second intermediate node and the common node while attenuating signals outside of the second frequency pass band, the second resonator circuitry comprising a third LC resonator and a fourth LC resonator that is electromagnetically coupled with the third LC resonator such that a coupling factor between the third LC resonator and the fourth LC resonator is between about 1.0% and 40.0%; and acoustic filtering circuitry coupled to the multiplexer circuitry and comprising:
- a first acoustic filter coupled to the first intermediate node and configured to separate signals within the first frequency pass band into one or more of a first set of sub-bands; and
- a second acoustic filter coupled to the second intermediate node and configured to separate signals within the second frequency pass band into one or more of a second set of sub-bands.

12. The RF filtering circuitry of claim 11 wherein a quality factor of the first resonator circuitry and the second resonator circuitry is between about 10 and 300.

13. The RF filtering circuitry of claim 11 wherein the first LC resonator is electromagnetically coupled to the third LC resonator such that a coupling factor between the first LC resonator and the third LC resonator is between about 1.0% and 40.0%.

14. The RF filtering circuitry of claim 13 wherein:
- a coupling factor between the second LC resonator and the fourth LC resonator is less than about 1.0%; and
- a coupling factor between the first LC resonator and the fourth LC resonator is less than about 1.0%.

15. The RF filtering circuitry of claim 14 wherein a quality factor of the first resonator circuitry and the second resonator circuitry is between about 10 and 300.

16. The RF filtering circuitry of claim 11 wherein:
the first signal path comprises:
- a first coupling capacitor coupled between the common node and the first LC resonator;
- a second coupling capacitor coupled between the first intermediate node and the second LC resonator; and
- a third coupling capacitor coupled between the common node and the first intermediate node; and the second signal path comprises:
- a fourth coupling capacitor coupled between the common node and the third LC resonator;
- a fifth coupling capacitor coupled between the second intermediate node and the fourth LC resonator; and
- a sixth coupling capacitor coupled between the common node and the second intermediate node.

17. The RF filtering circuitry of claim 16 wherein:
- the first LC resonator comprises a first resonator inductor and a first resonator capacitor coupled in parallel between the first signal path and ground;
- the second LC resonator comprises a second resonator inductor and a second resonator capacitor coupled in parallel between the second signal path and ground;
- the third LC resonator comprises a third resonator inductor and a third resonator capacitor coupled in parallel between the first signal path and ground; and
- the fourth LC resonator comprises a fourth resonator inductor and a fourth resonator capacitor coupled in parallel between the second signal path and ground.

18. The RF filtering circuitry of claim 17 wherein one or more of the first coupling capacitor, the second coupling capacitor, the third coupling capacitor, the fourth coupling capacitor, the fifth coupling capacitor, the sixth coupling capacitor, the first resonator capacitor, the second resonator capacitor, the third resonator capacitor, and the fourth resonator capacitor are adjustable.

19. The RF filtering circuitry of claim 18 further comprising control circuitry configured to adjust a capacitance of one or more of the first coupling capacitor, the second coupling capacitor, the third coupling capacitor, the fourth coupling capacitor, the fifth coupling capacitor, the sixth coupling capacitor, the first resonator capacitor, the second resonator capacitor, the third resonator capacitor, and the fourth resonator capacitor in order to adjust one or more of the first frequency pass band and the second frequency pass band.

20. The RF filtering circuitry of claim 19 wherein:
- in a carrier aggregation mode, the control circuitry is configured to adjust a capacitance of one or more of the first coupling capacitor, the second coupling capacitor, the third coupling capacitor, the fourth coupling capacitor, the fifth coupling capacitor, the sixth coupling capacitor, the first resonator capacitor, the second resonator capacitor, the third resonator capacitor, and the fourth resonator capacitor such that the first frequency pass band and the second frequency pass band overlap; and
- in a standard mode, the control circuitry is configured to adjust a capacitance of one or more of the first coupling capacitor, the second coupling capacitor, the third coupling capacitor, the fourth coupling capacitor, the fifth coupling capacitor, the sixth coupling capacitor, the first resonator capacitor, the second resonator capacitor, the third resonator capacitor, and the fourth resonator capacitor such that there is no overlap between the first frequency pass band and the second frequency pass band.

* * * * *